United States Patent
Kim et al.

(10) Patent No.: US 8,420,457 B2
(45) Date of Patent: Apr. 16, 2013

(54) THIN FILM TRANSISTOR AND METHOD OF MANUFACTURING THE SAME

(75) Inventors: Min-Kyu Kim, Suwon-si (KR);
Tae-Kyung Ahn, Suwon-si (KR);
Jae-Kyeong Jeong, Suwon-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 752 days.

(21) Appl. No.: 12/382,341

(22) Filed: Mar. 13, 2009

(65) Prior Publication Data

US 2009/0256147 A1 Oct. 15, 2009

(30) Foreign Application Priority Data

Mar. 13, 2008 (KR) .................. 10-2008-0023180

(51) Int. Cl.
*H01L 21/00* (2006.01)
(52) U.S. Cl.
USPC ........... 438/149; 438/158; 438/161; 438/164; 257/E21.414
(58) Field of Classification Search .................. 438/158, 438/161, 151, 164, 149; 257/E21.414
See application file for complete search history.

(56) References Cited

U.S. PATENT DOCUMENTS

| | | | |
|---|---|---|---|
| 5,716,871 A * | 2/1998 | Yamazaki et al. | 438/635 |
| 7,115,904 B2 * | 10/2006 | Ishida et al. | 257/59 |
| 2005/0230752 A1 * | 10/2005 | Kanno et al. | 257/347 |
| 2006/0046339 A1 | 3/2006 | Seo et al. | |
| 2007/0069209 A1 * | 3/2007 | Jeong et al. | 257/57 |

FOREIGN PATENT DOCUMENTS

| | | |
|---|---|---|
| JP | 2006-108647 A | 4/2006 |
| JP | 2006-332606 A | 12/2006 |
| KR | 10-2001-0081579 A | 8/2001 |
| KR | 10-2006-0019977 A | 3/2006 |
| KR | 10 2006-0062260 A | 6/2006 |
| KR | 10-2007-0001564 A | 1/2007 |
| KR | 10-2007-0072204 A | 7/2007 |
| KR | 10-0741136 * | 7/2007 |
| KR | 10-0741136 B1 | 7/2007 |
| KR | 10 2007-0119899 A | 12/2007 |
| KR | 10 2009-0065951 A | 6/2009 |

OTHER PUBLICATIONS

Korean Office Action in KR 10-2008-0023180, dated Oct. 18, 2010 (Kim, et al.), Korean Office Action from prosecution of corresponding Korean application.

* cited by examiner

*Primary Examiner* — Michael Trinh
(74) *Attorney, Agent, or Firm* — Lee & Morse, P.C.

(57) ABSTRACT

A thin film transistor, including a transparent channel pattern, a transparent gate insulating layer in contact with the channel pattern, a passivation film pattern disposed on the channel pattern, a source/drain coupled to the channel pattern through a via hole in the passivation film pattern, and a gate facing the channel pattern, the gate insulating layer interposed between the gate and the channel pattern, wherein the passivation film pattern includes at least one of polyimide, photoacryl, and spin on glass (SOG).

14 Claims, 4 Drawing Sheets

THIN FILM TRANSISTOR AND METHOD OF MANUFACTURING THE SAME

BACKGROUND

1. Technical Field

Embodiments relate to a thin film transistor and a method of manufacturing the same.

2. Description of the Related Art

A thin film transistor (TFT) is a field effect transistor which may be manufactured on a substrate using a semiconductor thin film. TFTs have widely been used as, e.g., a drive device, a switching device, etc., to operate a pixel in a flat panel display, e.g., an organic light emitting display (OLED) or a liquid crystal display (LCD).

An electronic circuit board that is impact resistant and bendable or foldable has attracted attention as desirable element in electronic devices. The development of an organic TFT, which also has these properties, is desired.

An oxide TFT having improved panel lifetime and high resolution may be desirable because it may exhibit voltage uniformity, which is an advantage of amorphous silicon (a-Si). An oxide TFT may also exhibit high electron mobility, which is an advantage of low temperature polysilicon (LTPS).

In particular, the production of a TFT OLED panel using oxide may deposit the thin film at a relatively low temperature by, e.g., sputtering, without a need for a high-temperature deposition process. This may be simpler than oxidation of existing silicon. Thus, since the production of a TFT OLED panel may lower the manufacturing costs, it has been spotlighted as next generation technology.

However, since an optimal procedure for processing an oxide semiconductor has not yet been completely developed, there still remain problems, e.g., non-uniform dispersion and degradation of characteristics, e.g., electron mobility, of the TFT.

In an oxide TFT, the oxide semiconductor material may be sensitive to, e.g., radiation, ion bombardment from plasma, etc., which may occur in a dry etching process and a film forming process, e.g., chemical vapor deposition (CVD), physical vapor deposition (PVD), etc. Therefore, the characteristics of the oxide TFT device may be degraded, and also the dispersion of the TFT device on a TFT array substrate may be non-uniform.

The dry etching process and the film forming process described above may be used in a process forming an etch stop layer, a contact hole, and source and drain electrodes in a TFT manufacturing technique. The TFT may have a top gate structure or a bottom gate structure. A need exists for the development of material and process which has no adverse effects on the active layers during each process.

SUMMARY

Embodiments are therefore directed to a thin film transistor and a method of manufacturing the same, which substantially overcome one or more of the problems due to the limitations and disadvantages of the prior art.

It is therefore a feature of an embodiment to provide a method of manufacturing a TFT without using a harmful plasma process.

It is therefore another feature of an embodiment to provide a TFT having uniform dispersion of and improved characteristics.

At least one of the above and other features and advantages may be realized by providing a thin film transistor, including a transparent channel pattern, a transparent gate insulating layer in contact with the channel pattern, a passivation film pattern disposed on the channel pattern, a source/drain coupled to the channel pattern through a via hole in the passivation film pattern, and a gate facing the channel pattern, the gate insulating layer interposed between the gate and the channel pattern, wherein the passivation film pattern includes at least one of polyimide, photoacryl, and spin on glass (SOG).

The thin film transistor may further include a plasma processing layer between the channel pattern and the source and drain.

The channel pattern may include an oxide semiconductor.

The substrate may include at least one of silicon, glass, plastic, and sapphire.

At least one of the above and other features and advantages may also be realized by providing a method of manufacturing a thin film transistor, including forming a transparent channel pattern on a substrate, forming a transparent gate insulating layer in contact with the channel pattern, forming a passivation film pattern on the channel pattern, forming a source/drain coupled to the channel pattern through a via hole in the passivation film pattern, and forming a gate facing the channel pattern, the gate insulating layer interposed between the gate and the channel pattern, wherein the passivation film pattern includes at least one of polyimide, photoacryl, and spin on glass (SOG) materials.

The method may further include curing the passivation film pattern through at least one of heat treatment and optical treatment.

Forming the passivation film pattern may include coating the channel layer in a desired pattern with an ink-jet printer.

Forming the passivation film pattern may include at least one of spin coating, bar coating, slit coating, dip coating, roll coating, and spray coating.

Forming the passivation film pattern may include attaching a passivation film pattern onto the channel pattern.

The method may further include plasma-processing at least a portion of the channel pattern exposed through the via hole in the passivation film pattern.

The thin film transistor may have a top gate structure.

The thin film transistor may have a bottom gate structure.

The method may further include forming a buffer layer on the substrate.

The channel pattern may include an oxide semiconductor.

The substrate may include at least one of silicon, glass, plastic, and sapphire.

Forming the passivation film pattern may include depositing a passivation film layer on the channel pattern, depositing a photoresist on the passivation film layer, exposing and developing the photoresist through a photo mask, and patterning the passivation film layer by wet etching, wherein the passivation film layer includes at least one of polyimide, photoacryl, and spin on glass (SOG) materials.

The method may further include plasma-processing at least a portion of the channel pattern exposed through the via hole in the passivation film pattern.

BRIEF DESCRIPTION OF THE DRAWINGS

The above and other features and advantages will become more apparent to those of ordinary skill in the art by describing in detail exemplary embodiments thereof with reference to the attached drawings, in which.

DETAILED DESCRIPTION

Figure 1A:
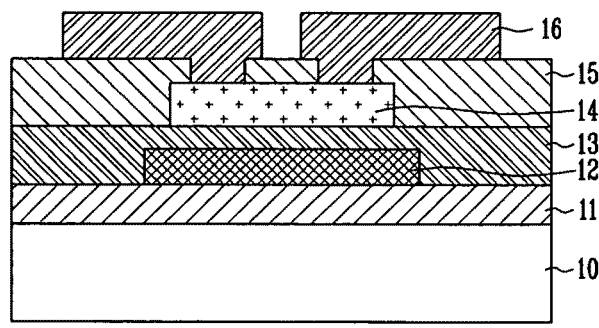
FIGS. 1A and 1B illustrate cross-sectional views of a thin film transistor according to an embodiment.

Korean Patent Application No. 10-2008-0023180, filed on Mar. 13, 2008, in the Korean Intellectual Property Office, and entitled: "Thin Film Transistor and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an $n^{th}$ member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B and, C together, whereas the expression "either A, B, or C" means one of A alone, B alone, and C alone, and does not mean any of both A and B together; both A and C together; both B and C together; and all three of A, B and C together.

As used herein, the terms "a" and "an" are open terms that may be used in conjunction with singular items or with plural items. For example, the term "an oxide semiconductor material" may represent a single compound, e.g., ZnO, or multiple compounds in combination, e.g., ZnO mixed with $SnO_2$.

In the following, when an element is referred to as being "connected to" another element, it can be directly connected to the element or be indirectly connected to the element with one or more intervening elements interposed therebetween. Hereinafter, like reference numerals refer to like elements.

Here, the "source," the "drain," and the "gate" mean a source terminal, a drain terminal, and a gate terminal, respectively, of a three-terminal field effect transistor (FET) used to constitute a transistor circuit.

The terms "insulating property" and "substantially insulating property" are used to describe insulating materials having a resistance of about 1010 Ωcm or more, and semi-insulating materials having a resistance of about 103 Ωcm to about 1010 Ωcm, respectively.

The terms "transparent" and "substantially transparent" mean a structure or material transmitting all or most light from a visible area and/or some ultraviolet area of an electromagnetic spectrum.

The "channel pattern," which may be positioned on and across a channel area, means the semiconductor pattern including the source area and drain area which are electrically coupled with the source and the drain.

When there is any layer on the substrate, the "upper" and the "lower" means that the lower of the layer is disposed at a place which the substrate is positioned and the upper of the layer is disposed at an opposite place where the substrate is positioned.

Hereinafter, exemplary embodiments will be described in a more detailed manner with reference to the accompanying drawings. However, embodiments may be changed in many different forms and should not be construed as limited to the embodiments set forth herein.

Figure 1B:
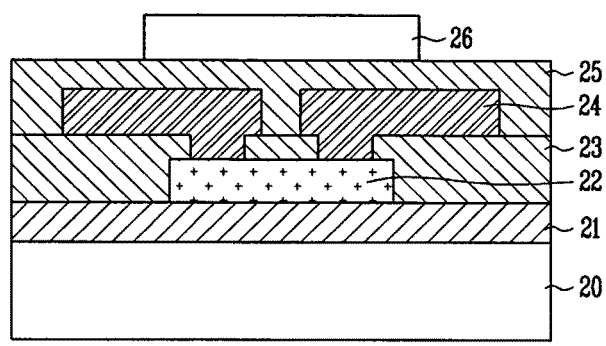

FIGS. 1A and 1B illustrate cross-sectional views of a TFT according to an embodiment.

Referring to FIG. 1A, the TFT may have a bottom gate structure and may include a substrate 10, a buffer layer 11, a gate 12, a gate insulation film 13 including a transparent material, a channel pattern 14 including a transparent material, a passivation film pattern 15, and a source/drain 16.

The passivation film pattern 15 may prevent the deterioration of the channel pattern 14. The passivation film pattern 15 may include a photopatternable material. The photopatternable material may include, e.g., materials capable of direct patterning, e.g., through a photolithography process, and patterning with a photoresist. Such materials may include, e.g., polyimide, photoacryl, spin on glass (SOG), etc. Photoacryl may include a monomer which may be polymerized by heat and/or light. The passivation film pattern 15 may have a thickness of about 300 Å to about 3000 Å.

The substrate 10 may include transparent and/or bendable materials. The substrate 10 may be formed of, e.g., silicon, glass, plastic, sapphire, etc.

The channel pattern 14 may include, e.g., transparent materials with insulating properties. The channel pattern 14 may include oxide-based semiconductor materials, e.g., ZnO, $SnO_2$, ZnSnO, CdSnO, GaSnO, TiSnO, ZnInO, ZnGaO, GaInZnO, CuAlO, SrCuO, LaCuOS, etc.

The gate insulation film 13 may include a transparent material and may be disposed adjacent to the channel pattern 14, so as to define the channel pattern 14 and interface. The gate insulation film 13 may include, e.g., an oxide film, a nitride film, a multilayer film thereof, other transparent insulating materials, etc.

The gate 12 and the source and drain 16 may include, e.g., transparent materials or translucent materials. The gate 12 and the source and drain 16 may each include metals with good conductivity and transparency, e.g., ITO (indium tin oxide), IZO (indium zinc oxide), ITZO (indium tin zinc oxide), etc.

The TFT of an embodiment may include the passivation film pattern 15 including a photopatternable material, disposed on the channel pattern 14. As a result, a harmful plasma process may not be necessary in the manufacturing process. This may prevent any detrimental effects on the channel pattern 14, and the entire device, due to the plasma process. Omitting harsh plasma processing from the manufacturing process may result in uniform dispersion of and excellent characteristics in the TFT devices. The channel in a conventional thin film transistor, formed of e.g., ZnO, may have a sudden increase in electrical conductivity due to a deficiency in oxygen on the surface of the channel caused by plasma when the source/drain is dry-etched. However, in an embodiment, the passivation film pattern 15 may be deposited and/or patterned without using a plasma process. The occurrence of the problem described above may be prevented, making it possible to improve the characteristics and dispersion thereof in the TFT.

Because of the features of the TFT of the aforementioned embodiment, the TFT of an embodiment may also easily be used in the TFT having a top gate structure. As shown in FIG. 1B, the TFT having a top gate structure may include a substrate 20, a buffer layer 21, a substantially transparent channel pattern 22 with substantially insulating property, a passivation film pattern 23 disposed on the channel pattern 22, a source/drain 24, a substantially transparent gate insulation film 25, and a gate 26. The passivation film pattern 23 may include, e.g., photopatternable materials.

The TFT of an embodiment may have a top or bottom gate structure. Therefore, the TFT having a bottom gate structure will be described below as an example.

Figure 2:
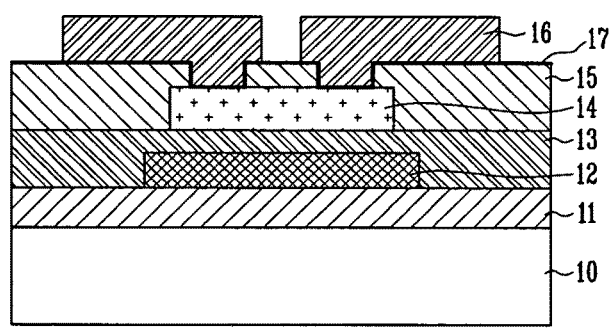
FIG. 2 illustrates a cross-sectional view of a TFT according to an embodiment.

FIG. 2 illustrates a cross-sectional view of a TFT according to an embodiment. Referring to FIG. 2, the TFT may include the channel pattern 14 including substantially transparent materials with substantially insulating properties. The TFT may also include the passivation film pattern 15 disposed on the channel pattern 14, and including photopatternable photosensitized materials. The source/drain 16 may contact the channel pattern 14 through a via hole in the passivation film pattern 15 and the plasma processing layer 17 disposed between the channel pattern 14 and the source/drain 16.

When the plasma processing layer 17 is formed at the interface of the channel pattern 14 and the source/drain 16, contact resistance may be reduced at the interface. This may beneficially improve electrical conductivity between the channel pattern 14 and the source/drain 16.

Figure 3A:
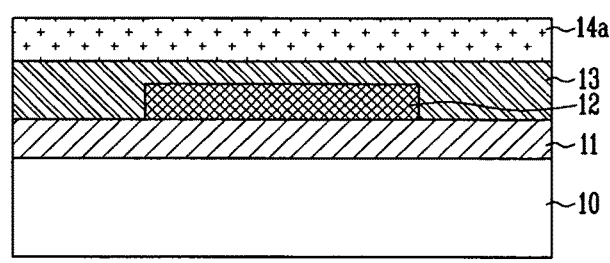
FIGS. 3A to 3E illustrate cross-sectional views of a manufacturing process of the TFT according to an embodiment.
Figure 3B:
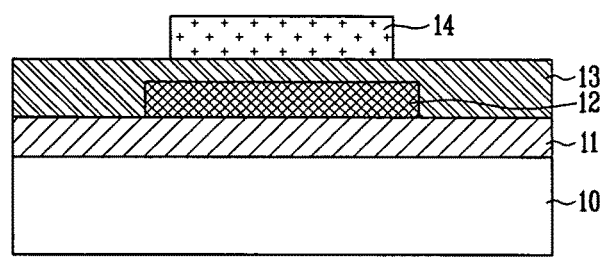

FIGS. 3A to 3E illustrate cross-sectional views of a manufacturing process of the TFT according to an embodiment. As shown in FIG. 3A, the buffer layer 11, the gate 12, and the gate insulating film 13 may be sequentially formed on the substrate 10. The substantially transparent material with substantially insulating property may be coated on the gate insulating film 13 to form a channel layer 14a. Herein, the channel layer 14a means a state prior to the patterning. As shown in FIG. 3B, the channel pattern 14 having the desired pattern may be formed by patterning the channel layer 14a.

Figure 3C:
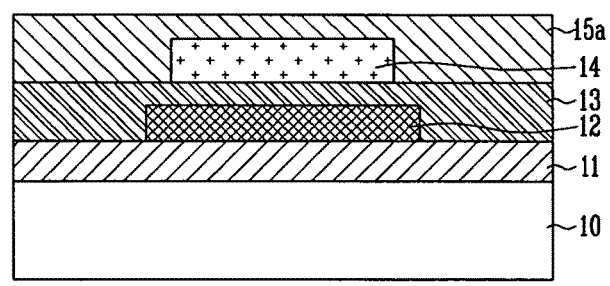

Next, as shown in FIG. 3C, the photopatternable material may be coated on the channel pattern 14 to form a passivation film layer 15a. Herein, the passivation film layer 15a means a state prior to patterning. The passivation film layer 15a may be formed by, e.g., a coating method using materials in a liquid form. The coating method may include, e.g., spin coating, bar coating, slit coating, dip coating, roll coating, spray coating, etc. The materials in the liquid form may include, e.g., polyimides such as polyimide, photoacryl such as acryl, spin on glass (SOG), etc. Further, the passivation film layer 15a may be stabilized through, e.g., optical treatment or heat treatment, e.g., soft baking. The heat treatment temperature may be about 80° C. to about 150° C., and the heat treatment time may be up to about 150 to about 300 seconds, depending on the materials used.

Figure 3D:
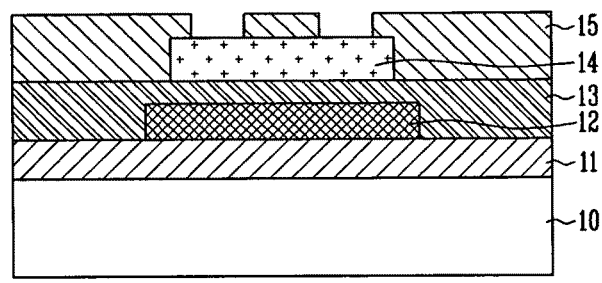

As shown in FIG. 3D, the passivation film layer 15a may be patterned to form the passivation film pattern 15 with the desired pattern. The passivation film pattern 15 may be formed with a via hole exposing at least a portion of the channel pattern 14.

Figure 3E:
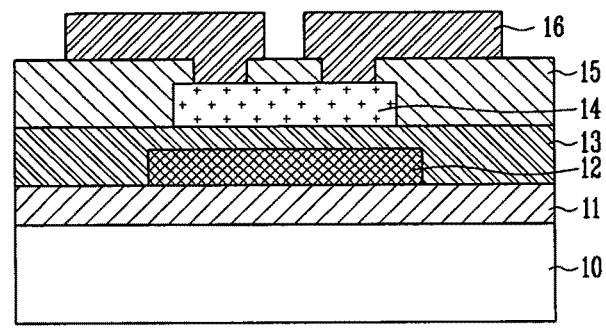

Next, as shown in FIG. 3E, conductive materials may be coated on the passivation film pattern 15. The coated passivation film pattern 15 may be patterned to form the source/drain 16, electrically coupled to the channel pattern 14 through the via hole in the passivation film pattern 15. Additionally, processes such as forming another via hole and/or a pixel defining layer may use, e.g., a general low-temperature process for processing polysilicon.

The above-mentioned manufacturing process may be partially or wholly conducted at a process temperature of about 250° C. or less. Therefore, when using a substrate vulnerable to a high temperature, e.g., plastic, the manufacturing process may safely be used.

Figure 4:
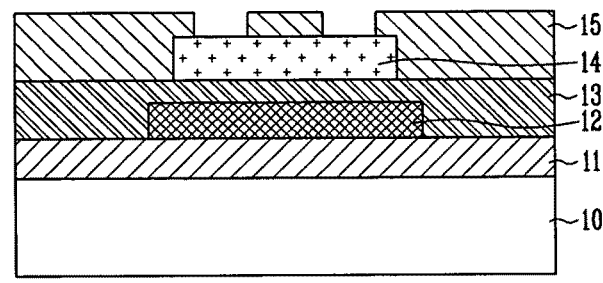
FIG. 4 illustrates a cross-sectional view of a manufacturing process of the TFT according to an embodiment.

FIG. 4 illustrates a cross-sectional view of a manufacturing process of the TFT according to an embodiment. A method of manufacturing the TFT of an embodiment may further include a separate light or heat treatment process, to advantageously improve the characteristics of the passivation film pattern 15, and the TFT device.

As shown in FIG. 4, in the method of manufacturing the TFT of an embodiment, the structure of FIG. 3D may be exposed with heat or light 18 during forming, curing the passivation film pattern 15. The heat treatment temperature may be about 130° C. to about 250° C. The heat treatment time may be about 200 seconds to about 2 hours. The heat treatment environment may include, e.g., atmospheric, vacuum, or inert gas conditions, depending on the materials to be used for the passivation film pattern 15.

Figure 5:
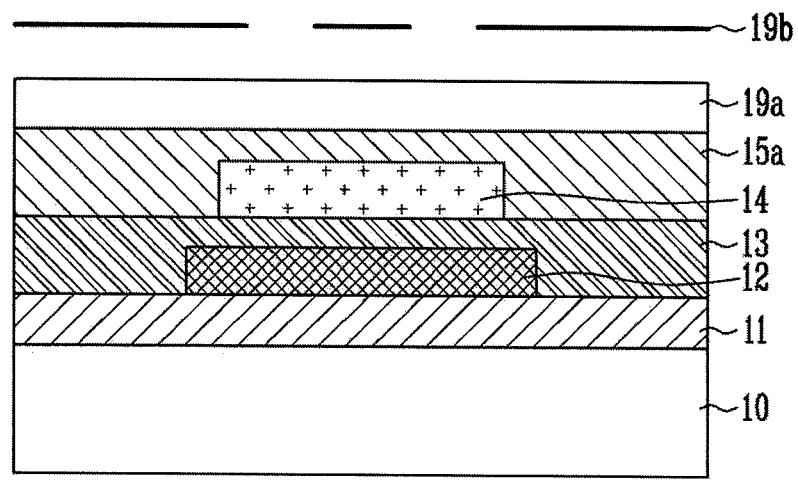
FIG. 5 illustrates a cross-sectional view of a manufacturing process of the TFT according to an embodiment.

FIG. 5 illustrates a cross-sectional view of a manufacturing process of a TFT according to an embodiment. The method of manufacturing the TFT of an embodiment may form the passivation film pattern 15 by a conventional photolithography technique using, e.g., a positive or negative type of photoresist.

As shown in FIG. 5, after the passivation film layer 15a including the photopatternable material shown in FIG. 3C is formed on the channel pattern 14, the passivation film layer 15a may be coated with a photoresist layer 19a. The photoresist layer 19a may be exposed by radiating, e.g., ultraviolet rays, onto the coated passivation film layer 15a through a photo mask 19b. The layers may then be developed by, e.g., a wet etching process. This may pattern the passivation film layer 15a. In a subsequent process, the passivation film pattern 15 may be cured through, e.g., a heat treatment process, e.g., hard baking, as shown in FIG. 4.

Embodiments may use a method of directly depositing the passivation film pattern 15, already having a predetermined pattern, on the channel pattern 14, in addition to the above-mentioned manufacturing methods. For example, the photopatternable material in the liquid phase may be coated on the channel pattern 14 in a desired pattern through, e.g., an inkjet printing technique. The passivation film pattern 15 may then be cured. The patterning process of the passivation film layer 15a may be omitted, making it possible to beneficially simplify the manufacturing process.

Alternatively, embodiments may use a method of directly depositing the cured passivation film pattern 15, already having a predetermined pattern, on the channel pattern 14, in addition to the above-mentioned manufacturing methods. The patterning process of the passivation film layer 15a, as well as the curing process of the passivation film pattern 15, may be eliminated, making it possible to desirably further simplify the manufacturing process.

The method of manufacturing the TFT of an embodiment may include a plasma process, in order to advantageously reduce the contact resistance between the channel pattern 14 and the source/drain 16, as illustrated in the TFT structure of FIG. 2. The plasma processing may be performed on a portion of the channel pattern 14 exposed through a via hole in the passivation film pattern 15. The plasma processing may progress at a level not generating the characteristic degradation of the channel layer, and may be performed to lower the contact resistance of the exposed channel layer.

The method of manufacturing the TFT of an embodiment may use a photolithography technique, instead of a plasma process, when forming the passivation film pattern 15 or the via hole to the transparent channel pattern 14. Therefore, it may prevent any detrimental effects on the channel pattern 14 caused by the plasma process, immediately after the channel layer 14a is patterned. In other words, it may provide the TFT with desirable and uniform characteristics. Also, when the TFT of an embodiment is used in a TFT array substrate of a flat panel display, the dispersion of the TFT may be uniform.

Figure 6:
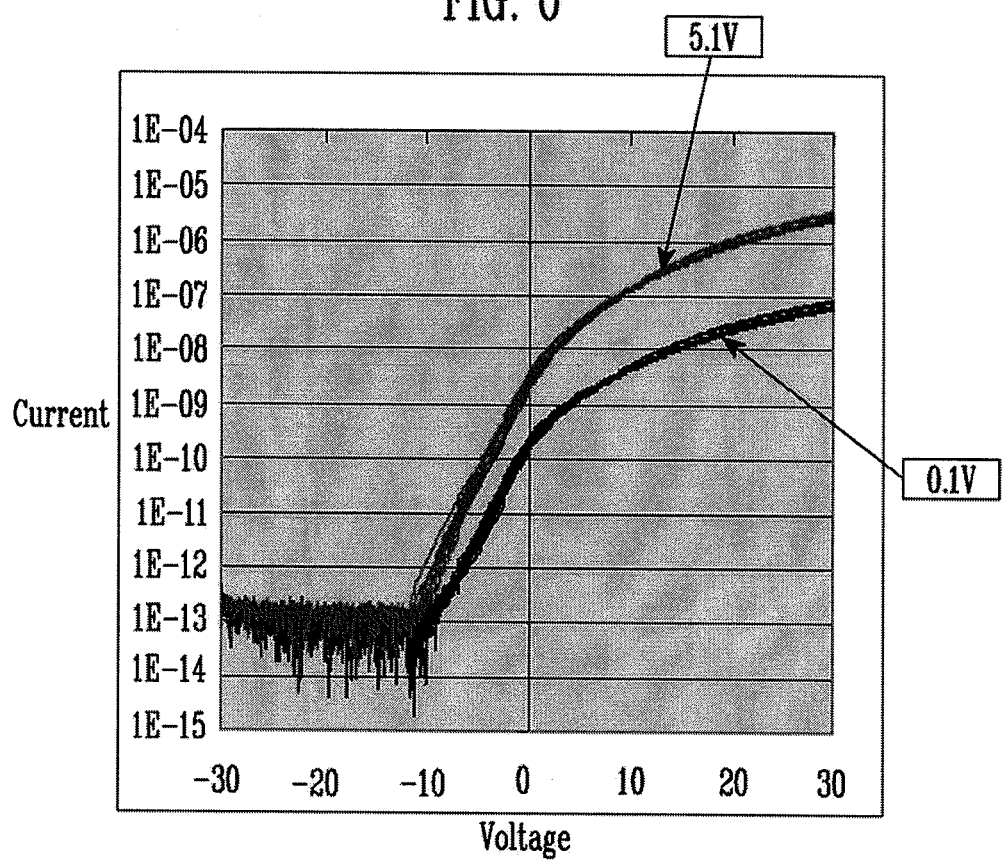
FIG. 6 illustrates a current-voltage characteristic graph showing characteristics of the TFT of an embodiment.

FIG. 6 illustrates a current-voltage characteristic graph showing the characteristics of the TFT of an embodiment. In an experiment, twelve TFTs, with the same structure as the structure shown in FIG. 1A, were disposed on a 185 mm×200 mm glass substrate. Then, characteristics of the respective TFTs were measured. Each TFT was manufactured such that the buffer layer 11, the gate 12, and the gate insulating film 13 were sequentially disposed on the glass substrate. In the TFT, a GaInZnO channel pattern 14 had a thickness of about 1000 Å, and a polyimide passivation film pattern 15 had a thickness of about 1 μm. The channel pattern 14 and the passivation film pattern 15 were disposed on the gate insulating film 13.

As shown in FIG. 6, when simultaneously measuring the current-voltage characteristic at 0.1 V and 5.1 V for the twelve example TFT devices, the TFT characteristic uniformity is improved to ±0.2 or less, as compared to the center value in threshold voltage ($V_{th}$), mobility, S-factor, etc. In FIG. 6, the vertical axis indicates current and the horizontal axis indicates voltage. An upper curve group of two curve groups indicates the current-voltage characteristic graphs of the twelve TFT devices measured at 5.1 V and a lower curve group indicates the current-voltage characteristic graphs of the twelve TFT devices measured at 0.1V.

The transistor, and the method of manufacturing the same, may prevent the characteristic degradation of the oxide TFT device due to ion bombardment, radiation, etc., caused by the plasma generated in the conventional film forming process or the wet etching process. Also, the dispersion of the oxide TFT device may be improved in the TFT array used as the pixel switching device or the current driving device of the flat panel display.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope as set forth in the following claims.

What is claimed is:

1. A method of manufacturing a thin film transistor, comprising:
    forming a transparent channel pattern on a substrate;
    forming a transparent gate insulating layer in contact with the channel pattern;
    forming a passivation film pattern on the channel pattern;
    plasma-processing at least a portion of the channel pattern exposed through a via hole in the passivation film pattern to form a plasma-processing layer;
    forming a source/drain coupled to the channel pattern through the via hole in the passivation film pattern; and
    forming a gate facing the channel pattern, the gate insulating layer interposed between the gate and the channel pattern,
    wherein the passivation film pattern includes at least one of polyimide, photoacryl, and spin on glass (SOG) materials.

2. The method of manufacturing a thin film transistor as claimed in claim 1, wherein forming the passivation film pattern includes coating the channel layer in a desired pattern with an ink-jet printer.

3. The method of manufacturing a thin film transistor as claimed in claim 1, wherein forming the passivation film pattern includes at least one of spin coating, bar coating, slit coating, dip coating, roll coating, and spray coating.

4. The method of manufacturing a thin film transistor as claimed in claim 1, wherein forming the passivation film pattern includes attaching a passivation film pattern onto the channel pattern.

5. The method of manufacturing a thin film transistor as claimed in claim 1, wherein the thin film transistor has a top gate structure.

6. The method of manufacturing a thin film transistor as claimed in claim 1, wherein the thin film transistor has a bottom gate structure.

7. The method of manufacturing a thin film transistor as claimed in claim 1, further comprising forming a buffer layer on the substrate.

8. The method of manufacturing a thin film transistor as claimed in claim 1, wherein the channel pattern includes an oxide semiconductor.

9. The method of manufacturing a thin film transistor as claimed in claim 1, wherein the substrate includes at least one of silicon, glass, plastic and sapphire.

10. The method of manufacturing a thin film transistor as claimed in claim 1, wherein forming the passivation film pattern includes:
    depositing a passivation film layer on the channel pattern,
    depositing a photoresist on the passivation film layer,
    exposing and developing the photoresist through a photo mask, and
    patterning the passivation film layer by wet etching, wherein the passivation film layer includes at least one of polyimide, photoacryl, and spin on glass (SOG) materials.

11. The method of manufacturing a thin film transistor as claimed in claim 10, further comprising plasma-processing at least a portion of the channel pattern exposed through the via hole in the passivation film pattern.

12. The method of manufacturing a thin film transistor as claimed in claim 1, further comprising curing the passivation film pattern by heat treatment such that a heat treatment is about 250° C. or less and a heat treatment time is about 2 hours or less.

13. The method of manufacturing a thin film transistor as claimed in claim 1, wherein the plasma-processing layer is formed between the channel pattern and the source/drain.

14. The method of manufacturing a thin film transistor as claimed in claim 1, wherein the plasma-processing layer is formed on the passivation film pattern and the portion of the channel pattern exposed through the via hole in the passivation film pattern.

\* \* \* \* \*